United States Patent [19]

Moonen

[11] Patent Number: 5,300,886
[45] Date of Patent: Apr. 5, 1994

[54] METHOD TO ENHANCE THE SENSITIVITY OF MRI FOR MAGNETIC SUSCEPTIBILITY EFFECTS

[75] Inventor: Chrit T. W. Moonen, Silver Spring, Md.

[73] Assignee: The United States of America as represented by the Department of Health & Human Services, Washington, D.C.

[21] Appl. No.: 841,994

[22] Filed: Feb. 28, 1992

[51] Int. Cl.$^5$ ............................................. G01R 33/20
[52] U.S. Cl. ..................................................... 324/309
[58] Field of Search ............... 324/300, 307, 308, 309, 324/310, 311, 312, 313, 314, 318, 322; 128/653.2, 653.5

[56] References Cited

U.S. PATENT DOCUMENTS 4,986,272  1/1991  Riederer et al. .................... 128/653

FOREIGN PATENT DOCUMENTS

4104246A1  8/1991  Fed. Rep. of Germany .

OTHER PUBLICATIONS

A. Villringer et al, "Dynamic Imaging with Lanthanide Chelates in Normal Brain: Contrast Due to Magnetic Susceptibility Effects", *Magn. Reson. Med.*, vol. 6 (1988), pp. 164–174.

B. R. Rosen et al, "Perfusion Imaging by Nuclear Magnetic Resonance", *Magn. Reson. Q.*, vol. 5, No. 4 (1989), pp. 263–272.

C. T. W. Moonen et al, "Functional Magnetic Resonance Imaging in Medicine and Physiology", *Science*, vol. 250 (1990), pp. 53–61.

J. W. Belliveau et al, "Functional Mapping of the Human Visual Cortex by Magnetic Resonance Imaging", *Science*, vol. 254 (1990), pp. 716–719.

S. Ogawa et al, "Oxygenation-Sensitive Contrast in Magnetic Resonance Image of Rodent Brain at High Magnetic Fields", *Magn. Reson. Med.*, vol. 14 (1990), pp. 68–78.

R. Turner et al, "Echo-Planar Time Course MRI of Cat Brain Oxygenation Changes", *Magn. Reson. Med.*, vol. 22 (1991), pp. 159–166.

A. Haase et al, "FLASH Imaging. Rapid NMR Imaging Using Low Flip-Angle Pulses", *J. Magn. Reson.*, vol. 67 (1986), pp. 258–266.

D. Matthaei et al, "Regional Physiological Functions Depicted by Sequences of Rapid Magnetic Resonance Images", *Lancet*, vol. 2 (1985), p. 893.

F. W. Wehrli, "Fast-Scan Magnetic Resonance: Principles and Applications", *Magn. Reson. Q.*, vol. 6, No. 3 (1990), pp. 165–237.

G. Bodenhausen et al, "Selection of Coherence-Transfer Pathways in NMR Pulse Experiments", *J. Magn. Reson.*, vol. 58 (1984), pp. 370–388.

C. T. W. Moonen et al, "Highly Effective Water Suppression for in Vivo Proton NMR Spectroscopy (DRYSTEAM)", *J. Magn. Reson.*, vol. 88 (1990), pp. 28–41.

N. A. Lassen et al, *Tracer Kinetic Methods in Medical Physiology*, Raven Press, New York (1979), pp. 1–94.

F. Wehrli, "Principles of Magnetic Resonance", *Magnetic Resonance Imaging*, 2nd Edition (1982), Mosby–Year Book, St. Louis, Mo., pp. 3–66.

(List continued on next page.)

Primary Examiner—Michael J. Tokar
Attorney, Agent, or Firm—Lower, Price, LeBlanc & Becker

[57] ABSTRACT

A method for enhancing the sensitivity of gradient-recalled echo imaging for T2* effects in dynamic magnetic resonance imaging which involves the step of delaying gradient-recalled echoes so that the gradient-recalled echoes are subjected to magnetic susceptibility effects for an extended period of time. The gradient-recalled echoes are delayed beyond a subsequent radio frequency pulse by applying an additional gradient which dephases any gradient-recalled echo of spins that are excited in the radio frequency repetition time period in which said gradient-recalled echoes are produced.

20 Claims, 8 Drawing Sheets

OTHER PUBLICATIONS

Journal of Magnetic Resonance, vol. 91, No. 1, Jan. 1, 1991, Orlando Minn. US, pp. 204-208, Elimination of Steady-State Magnetization in Fast Gradient-Recalled Echo Imaging by the Use of Prefocused Pulses.

Journal of Magnetic Resonance, vol. 96, No. 1, Jan. 1, 1991, Orlando Minn. US, pp. 222-228. Reduction of Flow Artifacts in Fact Gradient Recalled Echo Imaging by the Use of Prefocused Pulses, A. R. C. Gates et al.

IEEE Transactions of Nuclear Science, vol. 34, No. 4, Aug. 1, 1987, New York US, pp. 1085-1088 Imaging Efficiency and Contrat Enhancement in The Fast Gradient Refocusing Technique.

Magnetic Resonance in Medicine, vol. 26, No. 1, Jul. 1, 1992, Duluth, Minn., US, pp. 184-189 A Fast Graident-Recalled MRI Technique with Increased Sensitivity to Dynamic Susceptibility Effects.

METHOD TO ENHANCE THE SENSITIVITY OF MRI FOR MAGNETIC SUSCEPTIBILITY EFFECTS

TECHNICAL FIELD

The present invention relates to magnetic resonance imaging (MRI). More particularly, the present invention relates to methods of enhancing the sensitivity of magnetic resonance imaging for susceptibility effects.

BACKGROUND ART

Several known functional MR imaging studies based on detection of temporary changes in T2* which result from local changes in magnetic susceptibility have been conducted. Among these are measurements of regional cerebral blood volume (RCBV) using a bolus injection of contrast agent (A. Villringer et al, *Magn. Reson. Med.*, Vol. 6 (1988), page 164; B. R. Rosen et al, *Magn. Reson. Q.*, Vol. 5 (1989), page 26; C. T. W. Moonen et al, *Science*, Vol. 250 (1990), page 53; J. W. Belliveau et al, *Science*, Vol. 254 (1990), page 716) and of local changes in brain oxygenation state (S. Ogawa et al, *Magn. Reson. Med.*, Vol. 14 (1990), page 68; R. Turner et al, *Magn. Reson. Med.*, Vol. 22 (1991), page 159). Most of these studies are carried out with echo-planar MRI methods because of their high intrinsic sensitive for T2*. In principle, conventional methods based on gradient-recalled echoes (A. Haase et al, *Magn. Reson.*, Vol. 67 (1986), page 258; D. Matthaei et al, *Lancet*, Vol. 2 (1985), page 893; F. W. Wehrli, *Magn. Reson. Q.*, Vol. 6 (1990), page 165) are also T2* sensitive, but the T2* sensitivity generally has to be compromised in order to reach the desired time-resolution. For example, blood volume measurements in the brain based on tracking the passage of a bolus of contrast agent require a timeresolution of the order of 1s per image due to the short transit time of blood. For 128 phase encode steps, this limits the TR (relaxation time) to about 8 ms and TE (echo time) to about 5 ms.

The present invention, hereafter referred to as an echo-shifted gradient-recalled echo method, involves methods of magnetic resonance imaging which have enhanced sensitivity to T2* changes, as compared to methods known heretofore.

DISCLOSURE OF THE INVENTION

It is one object of the present invention to provide a method of magnetic resonance imaging.

Another object of the present invention is to provide a method of enhancing the sensitivity of magnetic resonance imaging for magnetic susceptibility effects.

It is a further object of the present invention to provide a method of increasing the sensitivity of fast gradient-recalled echo imaging for T2* effects in dynamic in vivo magnetic resonance imaging.

A still further object of the present invention is to provide for a method of measuring blood flow and blood volume by magnetic resonance imaging.

According to these and further objects of the present invention which will become apparent as the description thereof is present below, there is provided by the present invention a method for performing MRI imaging of an object which involves:

subjecting an object to a first radio frequency pulse to produce a gradient-recalled echo having an echo time period, the radio frequency having a relaxation time period; and shifting the produced gradient-recalled echo so that the echo time of the gradient-recalled echo is greater than the relaxation time of the radio frequency.

The present invention also provides for a method for enhancing the sensitivity of gradient-recalled echo imaging for T2* effects in dynamic in vivo magnetic resonance imaging which involves the step of delaying a gradient-recalled echo so that the gradient-recalled echo is subjected to magnetic susceptibility effects for an extended period of time.

The present invention further provides for an improvement in known methods for producing MRI images in which gradient-recalled echoes are produced in a series of relaxation time periods, the improvement involving shifting the gradient-recalled echoes beyond the relaxation time periods in which they are produced.

BRIEF DESCRIPTION OF DRAWINGS

The present invention will be described with reference to the attached drawings which are given for non-limiting illustrative purposes only, in which:

FIG. 2b is a contrast agent concentration-time curve (corrected for the duration of the TE-weighting) for a conventional gradient-recalled echo sequence (symbol x) compared to a shifted-echo sequence (solid triangles) obtained utilizing equation 1 (below) applied to the data of FIG. 2a.

FIG. 3a is an image obtained with the echoshifted gradient-recalled method of the present invention (TE=14 ms, TR=9 ms) obtained at t=0, before an injection of bolus. FIG. 3b is an image obtained with an echo-shifted gradient-recalled method according to the present invention (TE=14 ms, TR=9 ms) obtained at t=8 s, at the maximum contrast agent concentration. FIG. 3c is a map (64×64) of relative cerebral blood volume as calculated from the complete series of thirty-two consecutive echo-shifted gradient-recalled images. FIG. 3d is a conventional spin-echo image (128×128) with TE=60 ms, TR=10-00 ms. Images A and B were obtained using an additional gradient of 0.05 T/m during 1 ms (half-sine wave) in the phase-encoded direction. Acquisition was 4 ms.

BEST MODE FOR CARRYING OUT THE INVENTION

The present invention is directed to a new concept of fast gradient-recalled echo imaging which allows the excellent time-resolution of fast gradient-recalled echo imaging but drastically enhances the sensitivity to T2* effects, and to a lesser degree, T2 effects.

The method of the present invention is based on a gradient-recalled echo technique, where the desired gradient-recalled echo is shifted so that the magnetic susceptibility effects on the resulting echo are more pronounced. This shifting of the gradient-recalled echo has been found to increase the echo-time TE to values larger than TR while maintaining full T2* sensitivity during the entire TE period because no RF (radio frequency) refocussing occurs.

The present invention is based on a pulse sequence that shifts the gradient-recalled echo preferably beyond the subsequent RF pulse without refocusing the chemical shift. According to one preferred embodiment of the present invention the gradient-recalled echo is shifted one complete TR period. In further embodiments of the present invention the gradient-recalled echo may be shifted less or more that one complete TR period utilizing the principles of the invention as discussed below.

The method of the present invention has been found to enhance the sensitivity of rapid magnetic resonance imaging for magnetic susceptibility effects. One particular advantage of the present invention is that the method allows for the measurement of blood flow and blood volume by magnetic resonance imaging using one or more boli of magnetic resonance imaging contrast agent(s) and for changes in intrinsic susceptibility effects without injection of magnetic resonance imaging contrast agents.

Figure 1A:
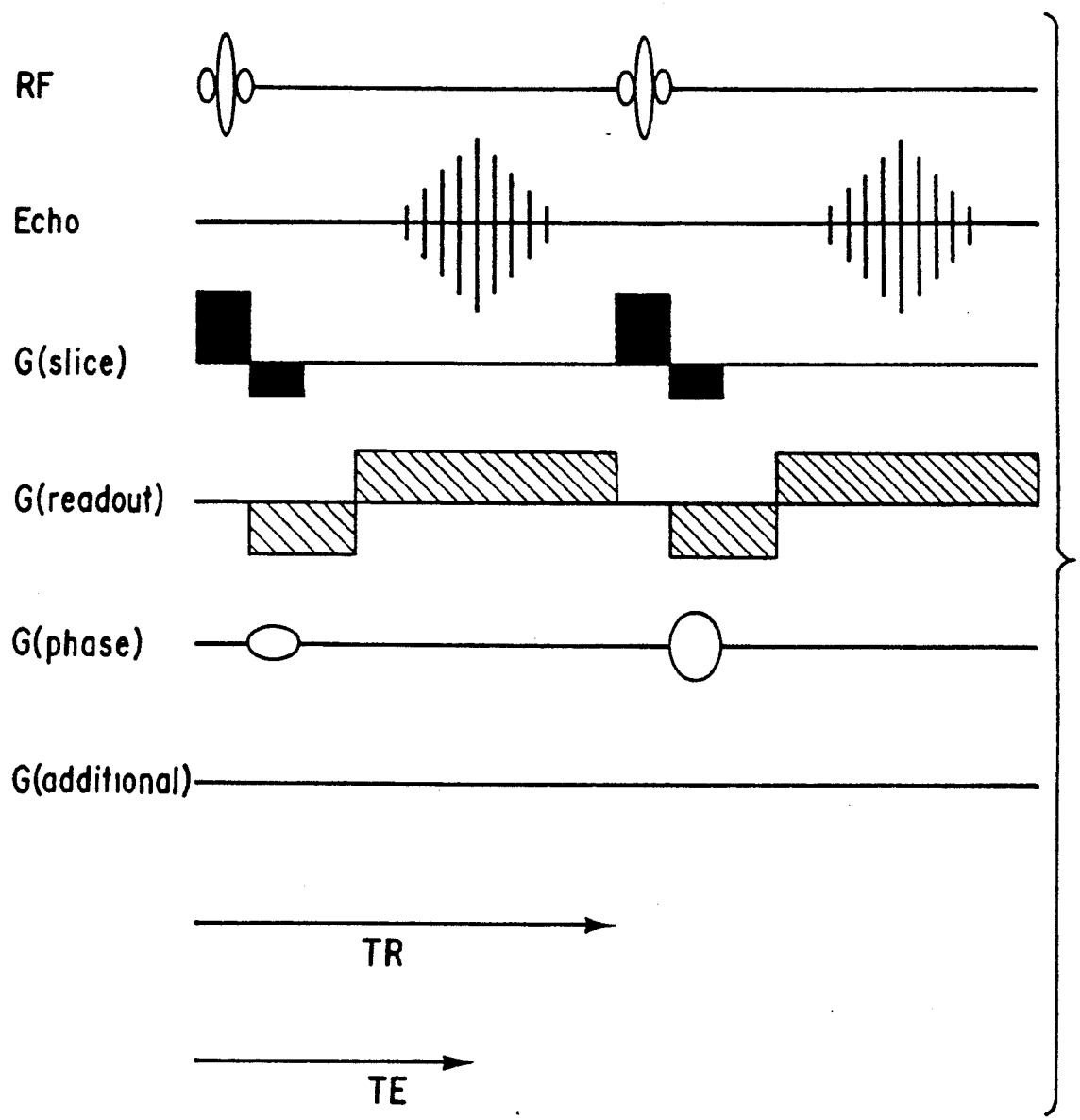
FIG. 1a is a pulse sequence for gradient-recalled echo imaging according to a conventional method.
Figure 1B:
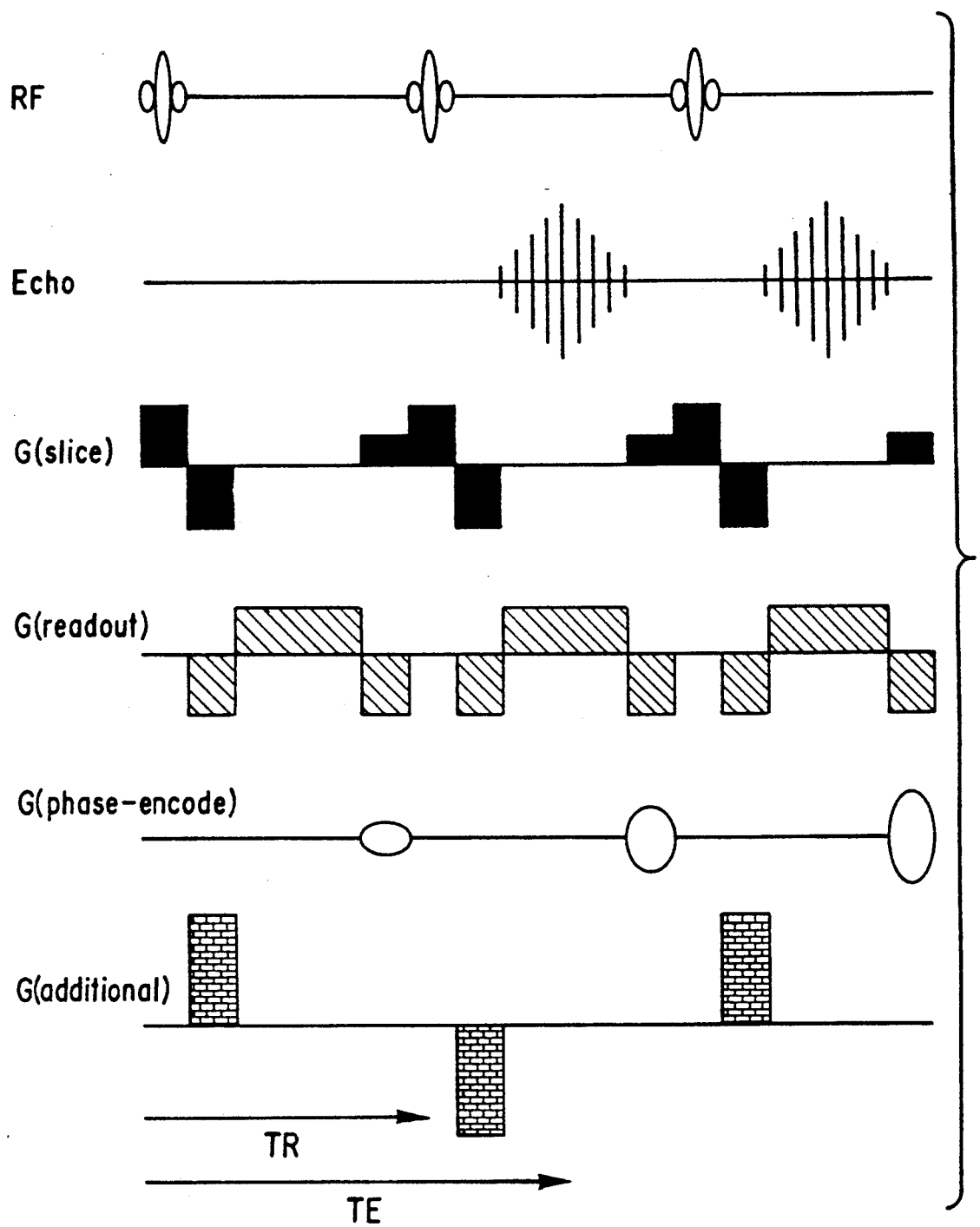
FIG. 1b is a pulse sequence for echo-shifted gradient-recalled echo imaging according to the present invention.

FIG. 1b is illustrative of the method of the present invention. This figure shows a convenient way to achieve the goal of the present invention. Some specifics illustrated, like the exact position of the phase-encoding gradient, is unimportant as would be realized by one skilled in the art.

As compared to conventional gradient-recalled echo imaging pulse sequences (FIG. 1a), the echo-shifted gradient-recalled echo imaging pulse sequence of the present invention (FIG. 1b) involves a first TR period in which no acquisition of data is performed. Phase encoding at the end of the first TR period is used to form an echo in the next TR period. In the first TR period an additional gradient pulse (crusher gradient) in any direction is applied to dephase the gradientrecalled echo in the first TR period. In subsequent TR periods, as shown, the polarity of the additional gradient pulse is switched in order that spins excited by the RF pulse in the n-th TR period are rephased in the (n+1)th period with respect to the additional gradient pulse.

A slice selective gradient applied in the first TR period is reversed in its entirely before the echo (and not approximately with half the integrated intensity as in conventional gradient-recalled echo sequences).

At the end of the first TR period approximately half of the slice selective gradient is added to arrive at the end of the TR period n with rephased magnetization of spins excited in the same n-th TR period.

In all following TR periods the additional gradient pulse is changed in sign in each subsequent TR period as noted above. Phase encoding is incremented in a conventional way k times. With the number of phase-encodings k, there are k+m TR periods, where m is the number of TR-period shifts (m is 1 in FIG. 1b).

Also in the following TR periods the slice selective gradient is reversed in its entirety before the echo (and not approximately with half the integrated intensity as in conventional gradient-recalled echo sequences).

At the end of the n following TR periods approximately half of the slice selective gradient is added to arrive at the end of the TR period n with rephased magnetization of spins excite in the same n-th TR period.

The principles and theory of magnetic resonance utilized in the method of the present invention will be described with reference to FIG. 1b hereafter. A general discussion of the basic principles and theory of magnetic resonance imaging can be found in F. Wehrli, "Principles of Magnetic Resonance", *Magnetic Resonance Imaging*, 2nd Edition (1992), Mosby-Year Book, St. Louis, Missouri, the disclosure of which is expressly incorporate herein by reference.

FIG. 1b shows a modified pulse sequence where TE is larger than TR. According to the present invention, the gradient-recalled echo of spins excited by the first RF pulse is refocussed in the second TR-period as discussed below. Likewise, the gradient-recalled echo of spins excited by the second RF pulse are refocussed in the third TR-period. In general, spins excited in the n-th period are refocussed in the (n+1)-th TR period. Thus, the echo produced by the RF pulse in one TR period is shifted to the next TR period. The shifted echo is realized by bringing the gradient-recalled echo spins in phase at a desired delayed echo-time (TE) with respect to each principal gradient and by dephasing other possible gradient- and spin-echoes. This is achieved by the use of an additional (crusher) gradient, a read-out gradient, a slice-select gradient, and a phase encode gradient as shown in FIG. 1b.

In the beginning of each TR period an additional (crusher) gradient is used to dephase any gradient-recalled echo of spins that are excited and would otherwise remain in the same TR-period. The polarity of the additional gradient is alternated for each Tr period as shown in order to rephase spins excited by the RF pulse applied during the n-th TR period in the (n+1)-th period with respect to the additional gradient. Any direction can be used for the additional gradient.

As shown, an applied slice-select gradient is reversed completely in the beginning of each TR period in order to maintain equal phase for all spins that were excited by the RF pulse in the previous TR-period. Following the acquisition period in the n-th TR period (of signal of spins excited in (n-1)th TP period), a gradient in the slice direction is used to bring spins in phase that were excited in n-th TR period.

Phase encoding is achieved at the end of each TR period by application of a phase-encode gradient in a known manner.

RF pulses in the subsequent sequences do not serve as refocussing pulses for rephased echoes. They serve as excitation pulses in the n-th TR-period leading to the desired echo in the (n+1)-th TR-period. Thus, transverse magnetization created in the n-th period leading to the echo in the (n+1)-th period remains unchanged by the RF pulse of the (n+1)-th TR-period.

Defining a coherence order for each TR-period following coherence pathway formalism as discussed by G. Bodenhausen et al, *J. Magn. Reson.*, Vol. 58 (1984), page 370; R. R. Ernst et al, *Principles of Nuclear Magnetic Resonance in One and Two Dimensions,* Clarendon Press, Oxford (1987), pages 118–119; C. T. W. Moonen et al, *J. Magn. Reson.*, Vol. 88 (1990), page 28, the disclosures of which are each expressly incorporated by reference, the coherence order $-1$ of the n-th TR-period remains $-1$ in the (n+1)-th TR-period until the echo is collected (desired coherence pathway p is $p(-1,-1)$). However, not all transverse magnetization created in the n-th TR-period will remain unchanged and lead to the desired echo, because a RF pulse is used between the two periods. This RF pulse of the (n+1)-th TR-period may convert some transverse magnetization. Following conventional coherence pathway formalism, the unchanged transverse magnetization (pathway p(−1,−1)) created in the n-th TR-period as a function of the RF pulse of the (n+1)-th TR-period with flip angle $\theta$ equals $\cos^2(\theta/2)$ times the originally created transverse magnetization.

For example, a flip angle of 30 degrees will leave more than 93% of the transverse magnetization unchanged and leads thus to a loss of less than 7%. Thus, the gradient scheme of the present invention leads to rephasing of only coherence path p(−1,−1), whereas all other pathways, leading to observable magnetization, are dephased.

The following examples are presented to illustrate features and characteristics of the present which is not to be construed as being limited thereto. In the examples, experiments were performed on a 4.7T Omega CSI instrument (General Electric), equipped with shielded gradients up to 18 G/cm. Animals were ventilated using isoflurane (1%) and a $N_2O/O_2$ mixture (7:3): blood pressure, blood gases and heart rate were monitored and kept normal. Succinylcholine (0.8%) was used as a muscle relaxant. For blood-volume measurements, imaging was started at t=0; at t=5s, 0.1 mmol/kg GD-DTPA (Magnevist, BERLEX) was manually injected in the femoral vein as a bolus with a duration of approximately 1s. A 47 mm diameter single-turn surface coil was positioned on the cat head and used for RF transmission and reception. Shimming was performed on the slice of interest resulting in a width of about 25 Hz at half height of the waller resonance.

EXAMPLE 1

In this example, the gradient sequence developed during the course of the present invention was applied to the assessment of cerebral blood volume and blood flow in the cat using dynamic contrast-enhanced susceptibility imaging according to principles published recently (A. Villringer et al, *Magn. Reson. Med.*, Vol. 6 (1988), page 164; B.R. Rosen et al, *Magn. Reson. Q.*, Vol. 5 (1989), page 26; J. W. Belliveau et al, *Science*, Vol. 254 (1990), page 716) and compared to a conventional gradient-recalled echo method. Each image was obtained within 600 ms as a 64×64 matrix. TR was 9 ms for both methods. TE was 5 ms f or the conventional method. Both sequences were otherwise identical except for the additional sequence of gradients of the present invention which resulted in an echo-time of 14 ms for the new sequence. Due to hardware limitations, a 400 ms delay was inserted between successive images resulting in an actual time-resolution of 1s for both methods.

Figure 2A:
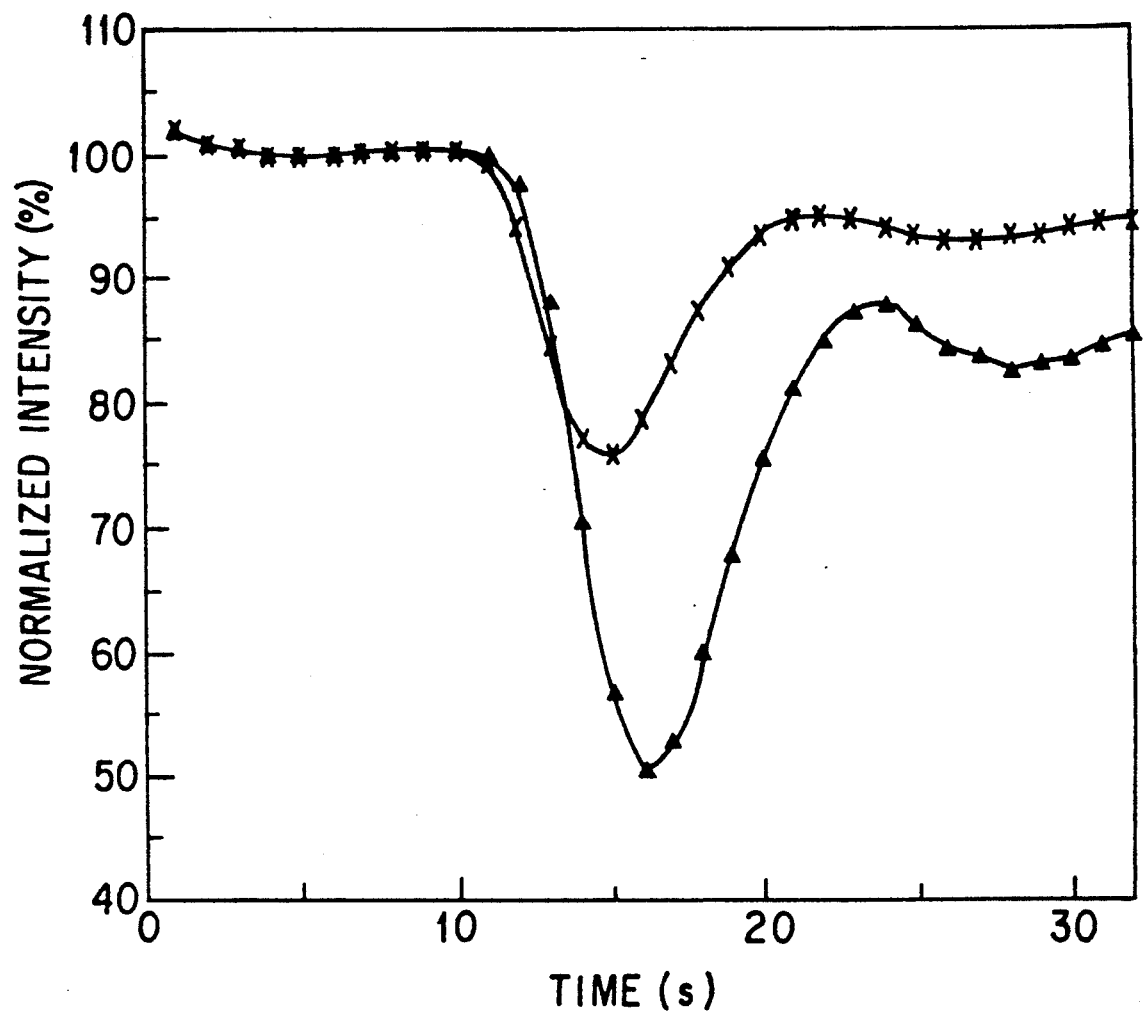
FIG. 2a is a plot of a normalized intensity ($S_c/S_o$) in percent as a function of time for a conventional gradient-recalled echo sequence (symbol x) which is compared to a shifted-echo sequence (solid triangles) according to the present invention.

FIG. 2a shows the total signal intensity (sum of all voxels with brain tissue) as a function of time using the conventional sequence (symbol x) as compared to the new method of the present invention (solid triangles) and demonstrates the much higher sensitivity of the new sequence to dynamic susceptibility effects.

EXAMPLE 2

Figure 2B:
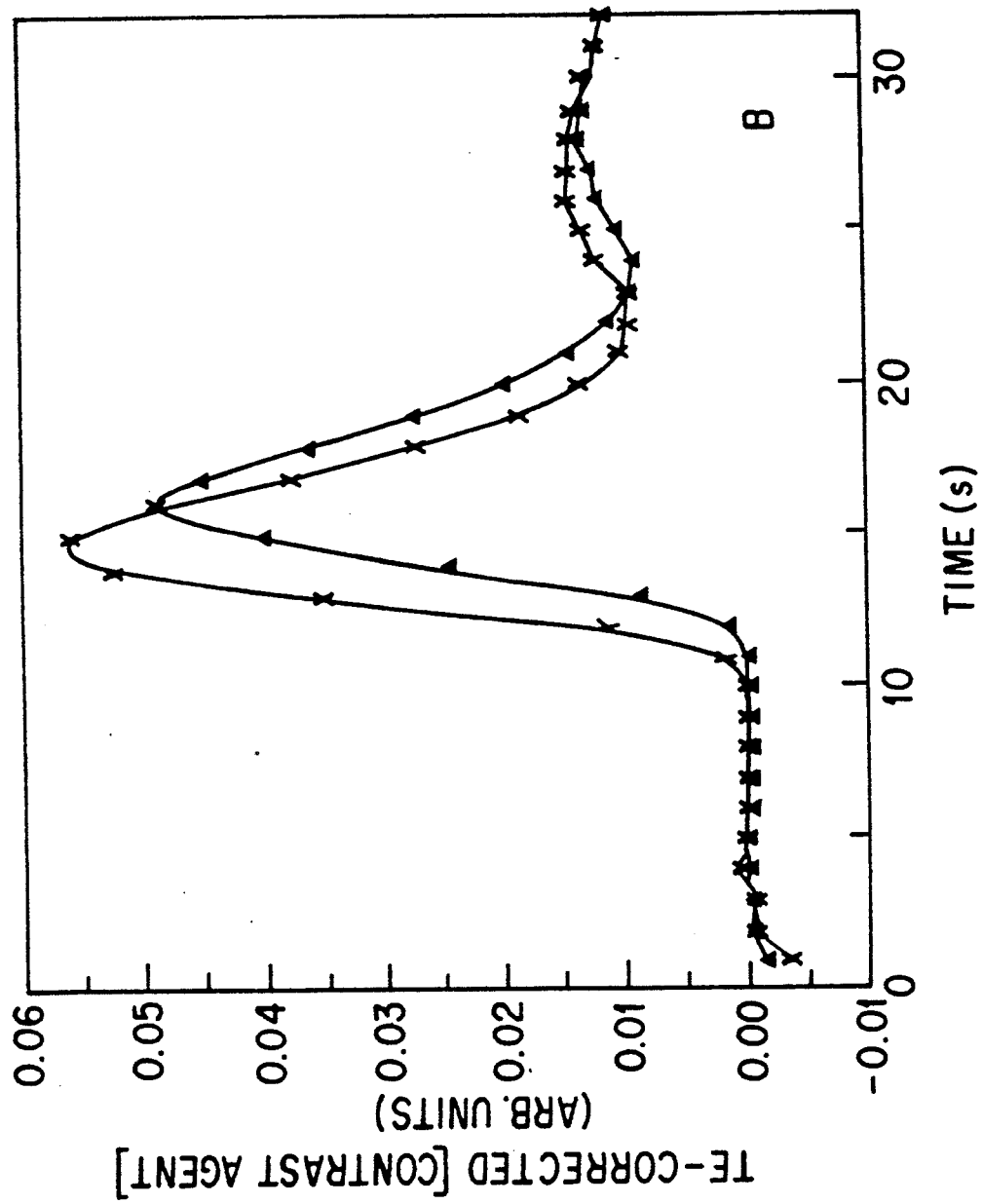

In this example, the data from Example 1 above were processed according to published theory (A. Villringer et al, *Magn. Reson. Med.*, Vol. 6 (1988), page 164; B. R. Rosen et al, *Magn. Reson. Q.*, Vol. 5 (1989), page 26; J. W. Belliveau et al, *Science*, Vol. 254 (1990), page 716). Changes in brain signal intensity due to transit of the bolus were converted to contrast agent concentration-time curve using the following approximate equation:

$$\frac{-\ln \frac{S_c}{S_o}}{TE} = k \text{ [contrast agent]} \quad [1]$$

where $S_o$ and $S_c$ refer to the signal intensity without and with contrast agent, respectively, and k is a proportionality constant which is dependent on field strength and the properties of the contrast agent. In order to quantitatively compare the new gradient sequence of the present invention to the conventional sequence the natural logarithm of signal attenuation was corrected for the duration of the TE weighing according to Eq. 1 and plotted versus time. The resulting graphs are shown in FIG. 2b. The similarity of the graphs for both sequences is reasonable given the approximate nature of Eq. 1.

EXAMPLE 3

Figure 3A:
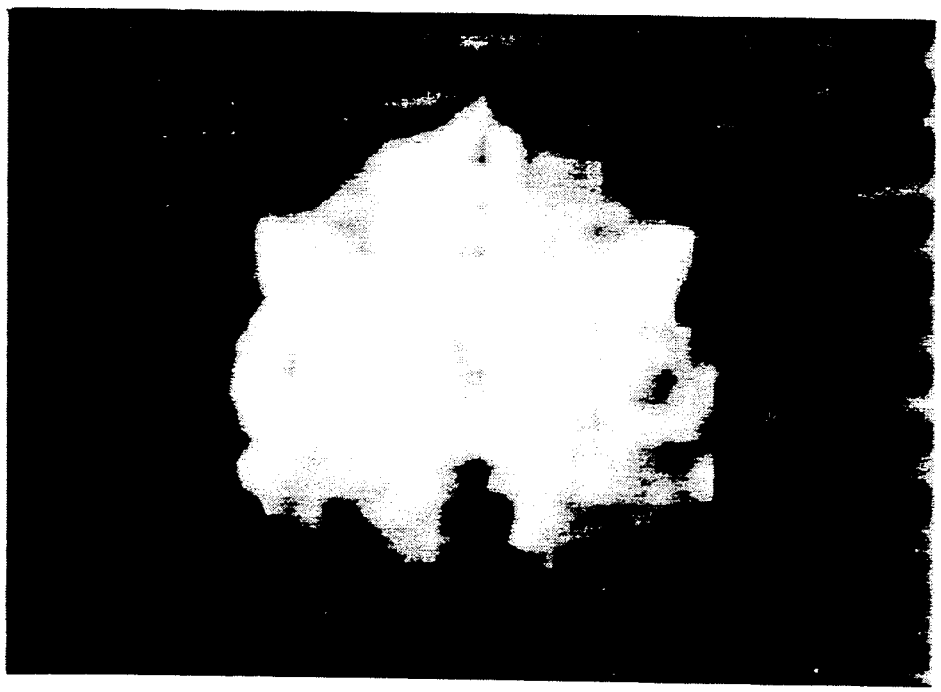
FIGS. 3a-3d are images (field-of-view 100×100 mm) obtained from the same axial slice through a cat brain.
Figure 3B:
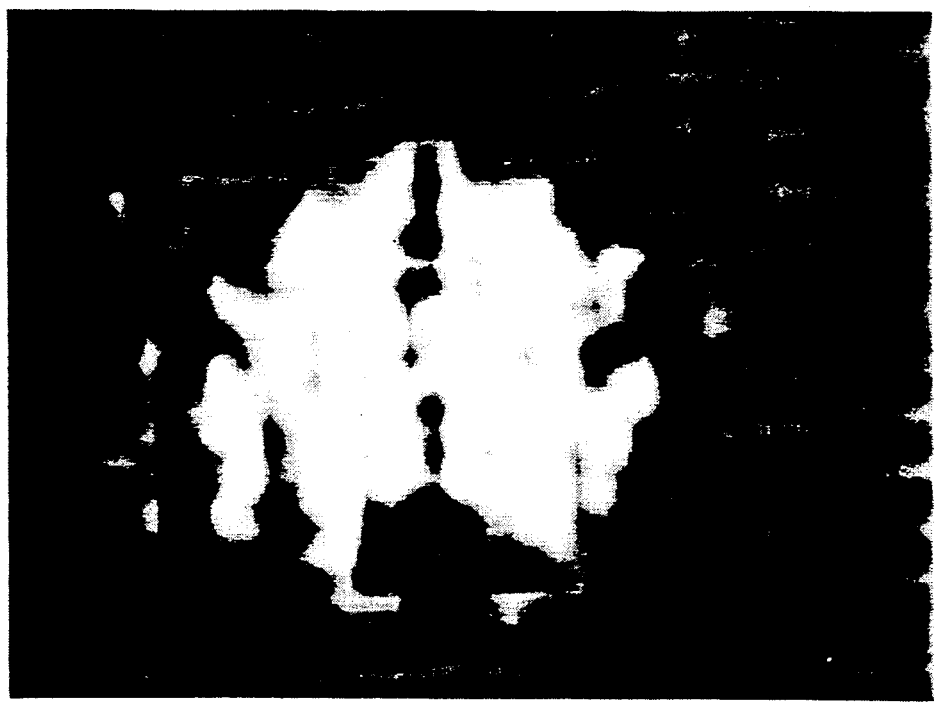
Figure 3C:
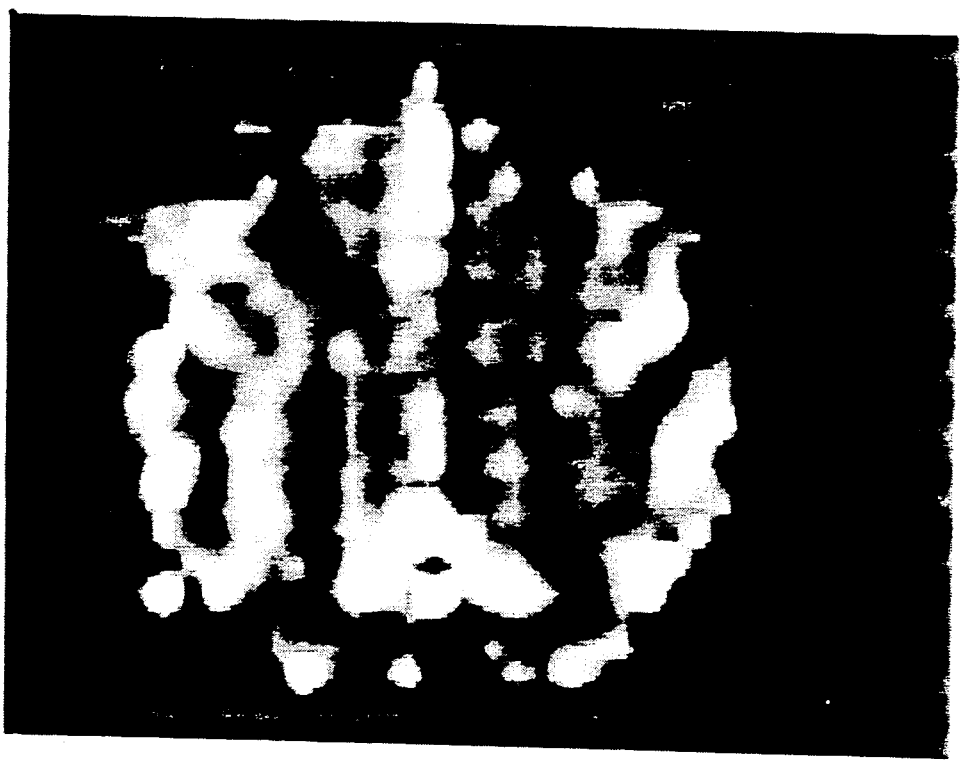
Figure 3D:
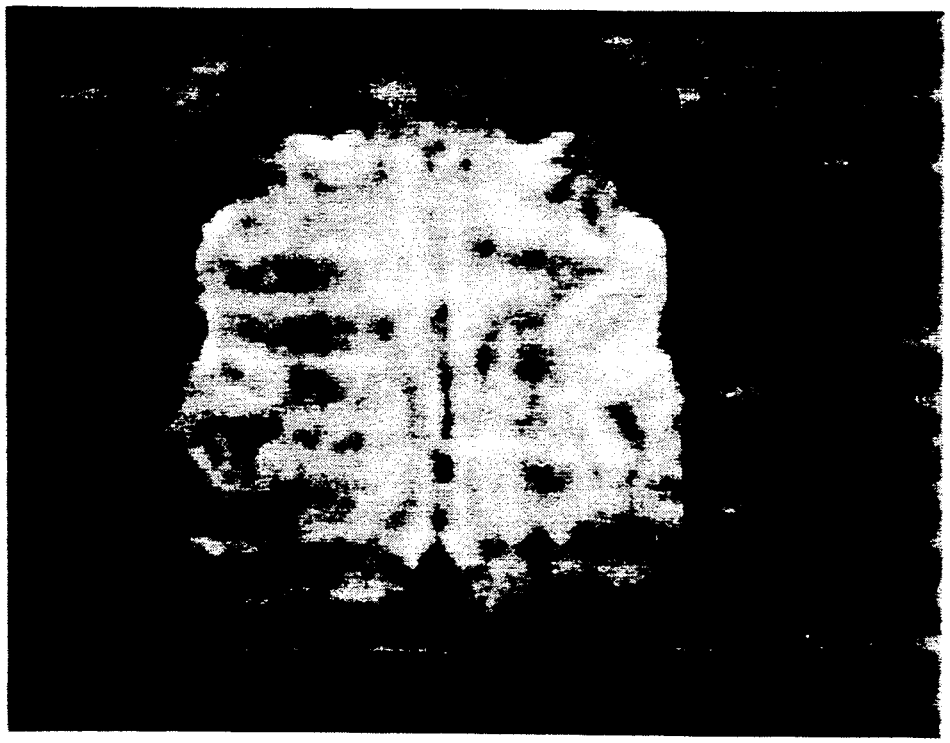

In this example images were obtained from the same axial slice of a cat brain and compared. The area under the concentration-time curve, corrected for recirculation, is proportional to blood volume according to conventional tracer kinetics theory (N. A. Lassen et al, *Methods in Medical Physiology*, Raven Press, New York (1979)). Such calculations were performed using a fit according to a gamma-variate function (A. Villringer et al, *Magn. Reson. Med.*, Vol. 6 (1988), page 164; B. R. Rosen et al, *Magn. Reson. Q.*, Vol. 5 (1989), page 26; J. W. Belliveau et al, *Science*, Vol. 254 (1990), page 716) for each voxel in order to generate images of relative cerebral blood volume (FIG. 3C). FIG. 3 also shows gradient-recalled echo images obtained with the new gradient sequence of the present invention at time t=0 (A) and at the highest concentration of contrast agent (B) A conventional 128×128 spin-echo (TE 60 ms, TR 1000 ms) image (D) is given for comparison. Large differences in RCBV between grey and white matter are evident from image C, as has been demonstrated previously (A. Villringer et al, *Magn. Reson. Med.*, Vol. 6 (1988), page 164; B. cm R. Rosen et al, *Magn. Reson. Q.*, Vol. 5 (1989), page 26). Note also the strong influence of $B_1$ inhomogeneity in A, B and D, but absent in the "calculated" image C.

The general principles of dynamic susceptibility enhanced gradient-recalled echo imaging according to the present invention has been demonstrated in theory, and in experiments on cerebral blood volume measurements in cat using bolus tracking principles based on T2* changes. The new methods of the present invention are easy to use and are, compared to echo-planar methods, less demanding with respect to gradient hardware and field homogeneity.

Although the present invention has been described with reference to particular means, materials and embodiments, from the foregoing description, one skilled in the art can easily ascertain the essential characteristics of the present invention and various changes and modifications may be made to adapt the various uses and conditions without departing from the spirit and scope of the present invention as described in the claims which follow.

What is claimed is:

1. A method for performing MRI imaging of an object which comprises:
    subjecting an object to a first radio frequency pulse to produce a gradient-recalled echo having an echo time period, said radio frequency having a time of repetition; and shifting the produced gradient-recalled echo so that the echo time of the gradient-recalled echo is greater than the time of repetition of the radio frequency.

2. A method for performing MRI imaging of an object according to claim 1, wherein said gradient-recalled echo is shifted beyond a second radio frequency pulse which follows said first radio frequency.

3. A method for performing MRI imaging of an object according to claim 2, wherein said gradient-recalled echo is shifted by applying a crusher gradient at the beginning of said time of repetition of said first radio frequency pulse which dephases any gradient-recalled echo spins that are excited and remain in the time of repetition of said first radio frequency pulse.

4. A method for performing MRI imaging of an object according to claim 3, wherein said crusher gradient is applied in the slice and/or phase direction.

5. A method for performing MRI imaging of an object according to claim 3, wherein subsequent crusher gradients are applied in subsequent radio frequency time of repetition, having alternately reversed polarities.

6. A method for performing MRI imaging of an object according to claim 3, wherein a slice gradient is applied in said relaxation time period of said first radio frequency pulse and subsequent radio frequency time of repetition, said slice gradient being reversed before encountering a shifted gradient-recalled echo.

7. A method for performing MRI imaging of an object according to claim 1, wherein said imaged object is a dynamic object.

8. A method for performing MRI imaging of an object according to claim 7, wherein said object comprises body fluid.

9. A method for performing MRI imaging of an object according to claim 8, wherein said body fluid comprises blood.

10. A method for performing MRI imaging of an object according to claim 1, wherein said method further includes injecting a contrasting agent into said object to be imaged.

11. A method for enhancing the sensitivity of gradient-recalled echo imaging for T2* effects in dynamic in vivo magnetic resonance imaging which comprises the step of delaying a gradient-recalled echo so that the gradient-recalled echo is subjected to magnetic susceptibility effects for an extended period of time longer than one TR-period.

12. A method for enhancing the sensitivity of gradient-recalled echo imaging for T2* effects in dynamic in vivo magnetic resonance imaging according to claim 11, wherein said gradient-recalled echo is delayed by shifting said gradient-recalled echo beyond a subsequent radio frequency pulse.

13. A method for enhancing the sensitivity of gradient-recalled echo imaging for T2* effects in dynamic in vivo magnetic resonance imaging according to claim 12, wherein said gradient-recalled echo is shifted by applying a crusher gradient at the beginning of a time of repetition of a radio frequency pulse in which said gradient recalled echo is produced which dephases any gradient-recalled echo spins that are excited and remain in the time of repetition in which said gradient recalled echo is produced.

14. A method for enhancing the sensitivity of gradient-recalled echo imaging for T2* effects in dynamic in vivo magnetic resonance imaging according to claim 13, wherein said crusher gradient is applied in the slice and/or phase direction.

15. A method for enhancing the sensitivity of gradient-recalled echo imaging for T2* effects in dynamic in vivo magnetic resonance imaging according to claim 13, wherein subsequent crusher gradients are applied in subsequent radio frequency repetition times, having alternately reversed polarities.

16. A method for enhancing the sensitivity of gradient-recalled echo imaging for T2* effects in dynamic in vivo magnetic resonance imaging according to claim 13, wherein a slice gradient is applied in said time of repetition in which said gradient-recalled echo is produced and subsequent radio frequency relaxation time periods, said slice gradient being reversed before encountering a shifted gradient-recalled echo.

17. A method for enhancing the sensitivity of gradient-recalled echo imaging for T2* effects in dynamic in vivo magnetic resonance imaging according to claim 12, wherein said in vivo magnetic resonance imaging comprises imaging the flow of body fluids.

18. A method for enhancing the sensitivity of gradient-recalled echo imaging for T2* effects in dynamic in vivo magnetic resonance imaging according to claim 17, wherein said body fluids include blood.

19. In a method for producing MRI images in which gradient-recalled echoes are produced in a series of radio frequency repetition time periods, the improvement comprising shifting said gradient-recalled echoes beyond the radio frequency repetition time periods in which they are produced.

20. A method for producing MRI images according to claim 19 wherein said improvement further comprises shifting said gradient-recalled echoes by application of a gradient which dephases any gradient-recalled echo spins that are excited and remain in the radio frequency repetition time period in which said gradient-recalled echoes are produced.

* * * * *